US006675578B1

(12) United States Patent
Sinclair

(10) Patent No.: US 6,675,578 B1
(45) Date of Patent: Jan. 13, 2004

(54) THERMAL BUCKLE-BEAM ACTUATOR

(75) Inventor: Michael J. Sinclair, Kirkland, WA (US)

(73) Assignee: Microsoft Corporation, Redmond, WA (US)

(*) Notice: Subject to any disclaimer, the term of this patent is extended or adjusted under 35 U.S.C. 154(b) by 0 days.

(21) Appl. No.: 09/575,436

(22) Filed: May 22, 2000

(51) Int. Cl.[7] .................................................. F01B 29/10

(52) U.S. Cl. ............................ 60/528; 60/527; 310/307
(58) Field of Search ................... 60/527, 528; 310/306, 310/307, 309

(56) References Cited

U.S. PATENT DOCUMENTS 5,909,078 A * 6/1999 Wood et al. ................. 310/307
5,955,817 A * 9/1999 Dhuler et al. ............... 310/307
6,333,583 B1 * 12/2001 Mahadevan et al. ........ 310/306

OTHER PUBLICATIONS

Linear Thermomechanical Microactuators, Rebecca Cragun and Larry L Howell, MEMS vol. 1, Microelectromechanical Systems (MEMS) 1999, ASME International Mechanical Engineering Congress and Exposition, Nov. 14–19, 1999.

* cited by examiner

*Primary Examiner*—Hoang Nguyen
(74) *Attorney, Agent, or Firm*—Ipsolon LLP

(57) ABSTRACT

An in-plane thermal buckle-beam microelectrical mechanical actuator is formed on a planar substrate of semiconductor material, for example. The actuator includes first and second anchors secured to the substrate and a floating center beam positioned between the first and second anchors and movable relative to the substrate. Symmetric first and second sets of elongated thermal half-beams are secured between opposite sides of the floating center beam and the respective first and second anchors. The half-beams are formed of semiconductor material, such as polysilicon. A current source directs electrical current through the thermal half beams via the anchors to impart thermal expansion of the thermal half-beams and hence linear motion of the floating center beam generally parallel to the substrate. In one implementation, the half-beams are configured at a bias angle to give the floating beam an affinity for in-plane motion. An actuator of the present invention with such bias angles can give the actuator an overall chevron configuration.

17 Claims, 9 Drawing Sheets

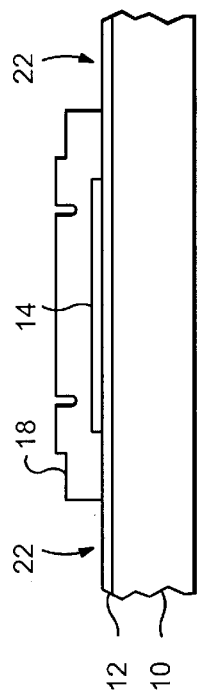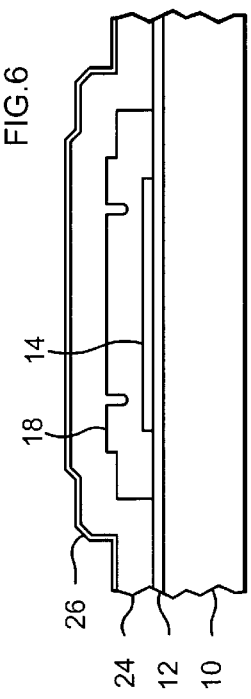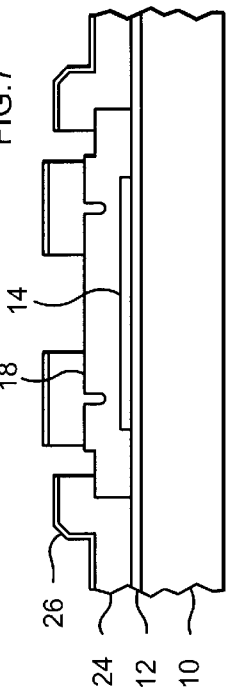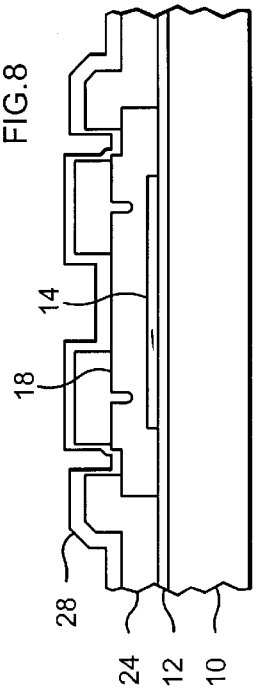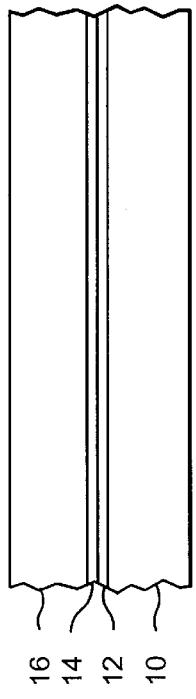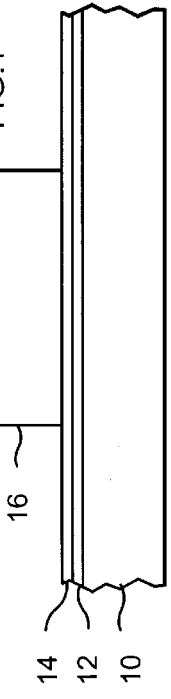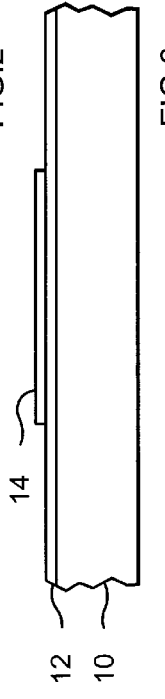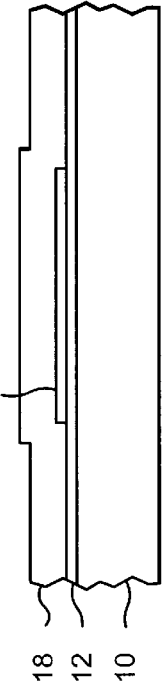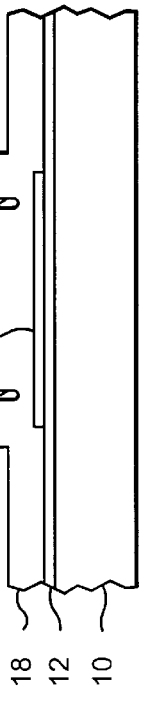

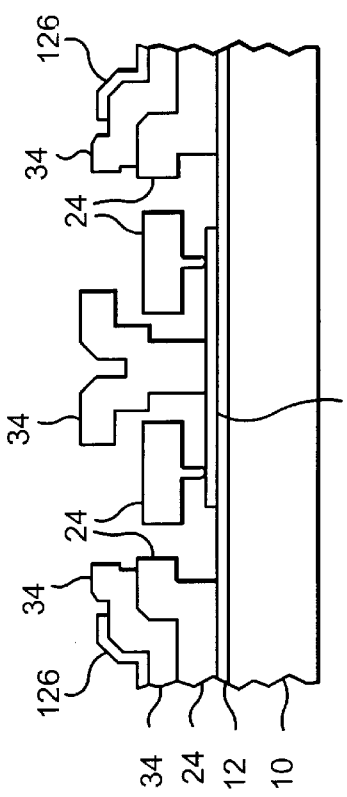
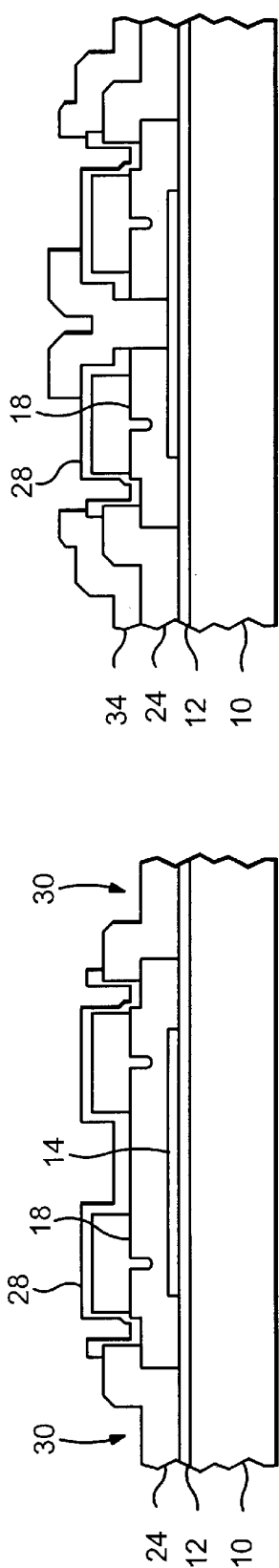
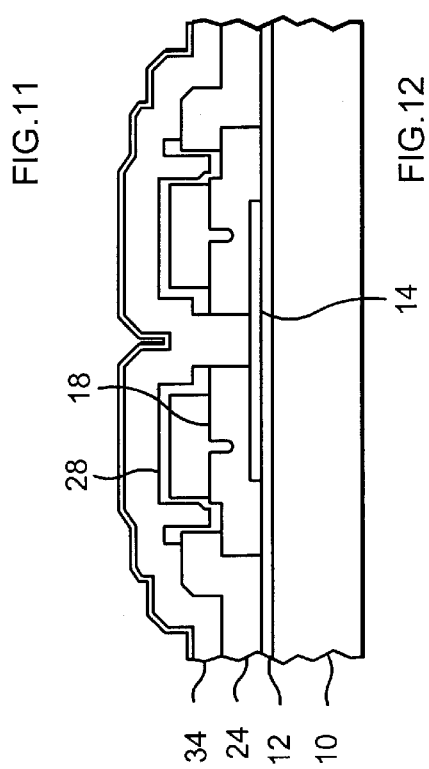
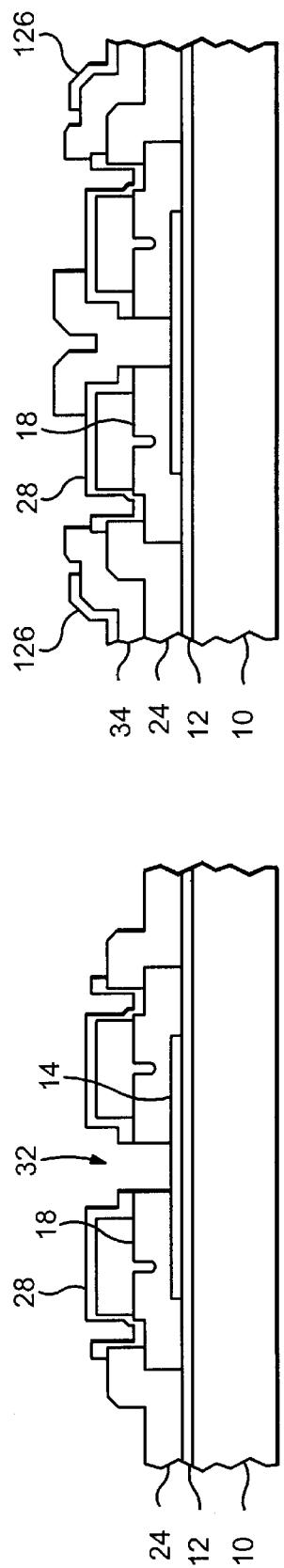

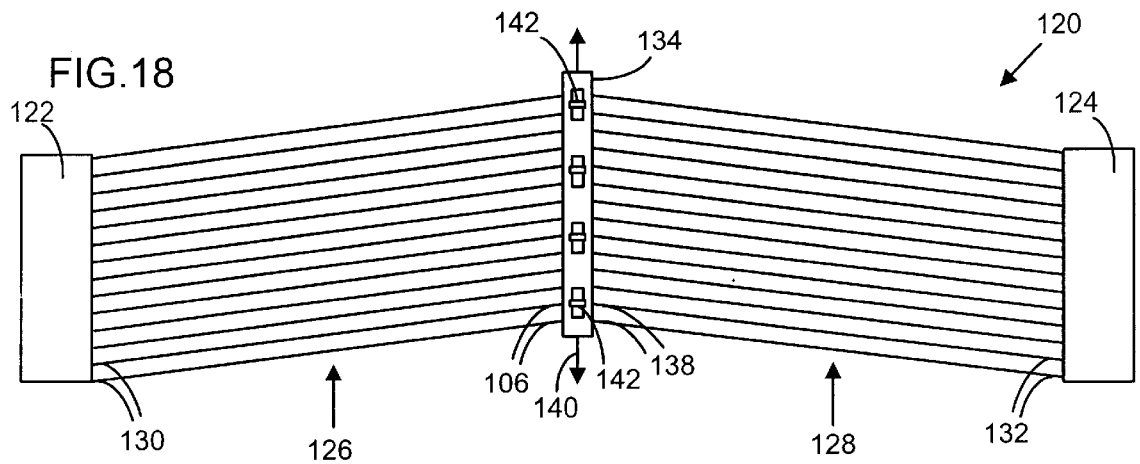
FIG. 18
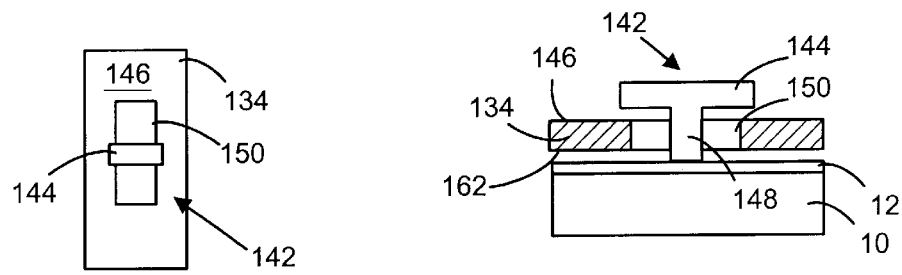
FIG. 19
FIG. 20
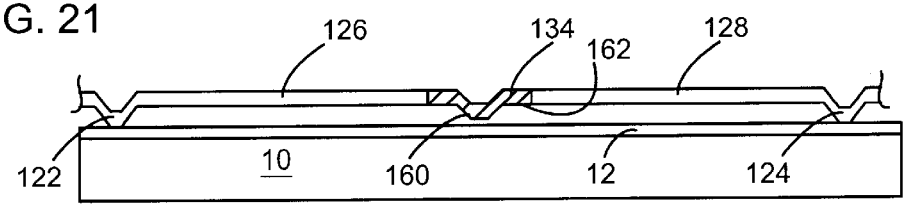
FIG. 21
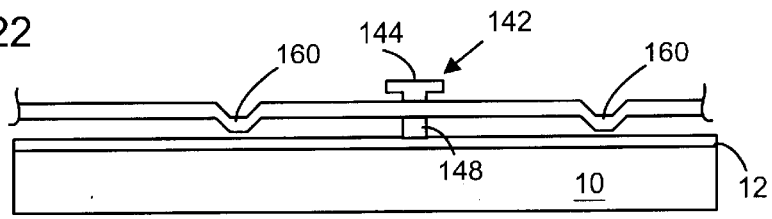
FIG. 22

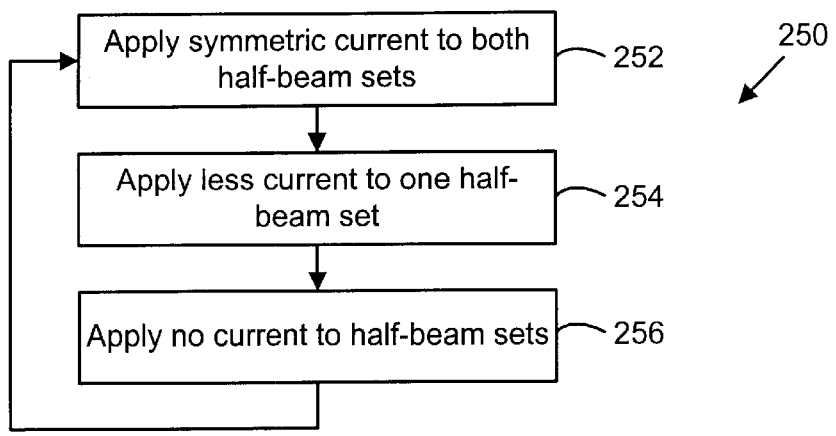
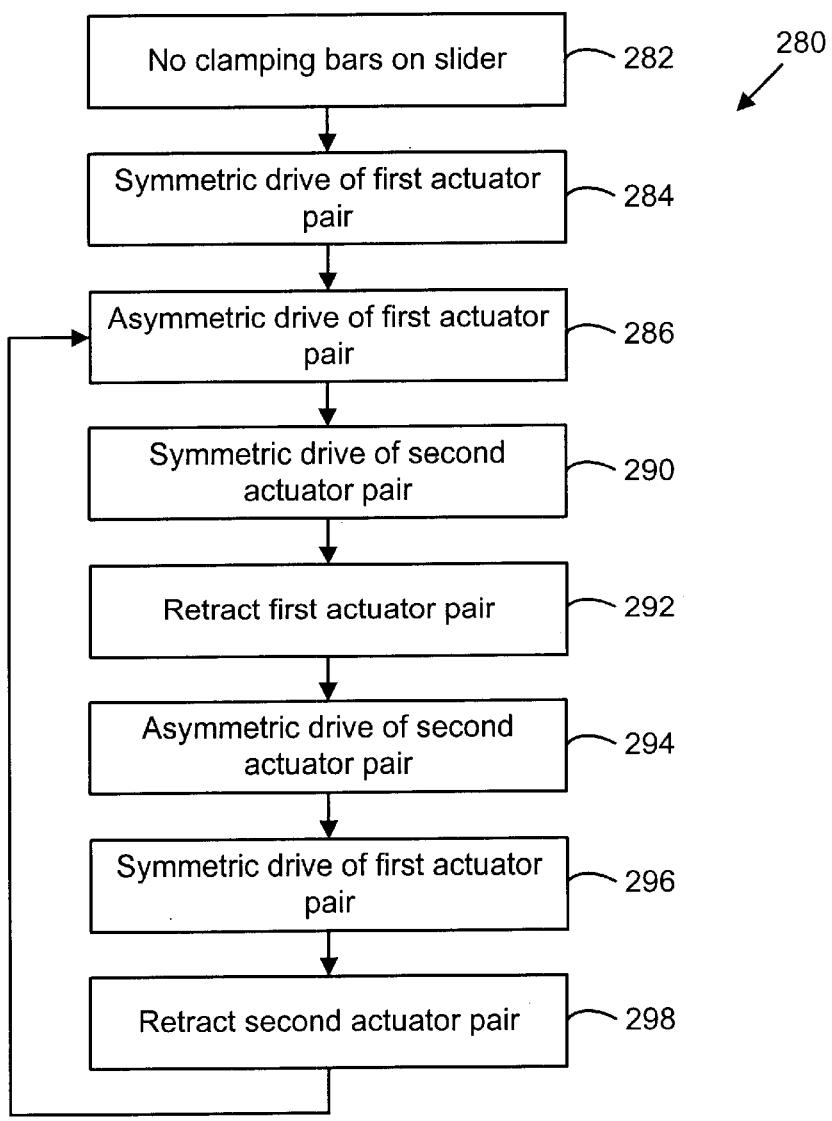

US 6,675,578 B1

THERMAL BUCKLE-BEAM ACTUATOR

FIELD OF THE INVENTION

The present invention relates to microelectromechanical system (MEMS) actuators and, in particular, to thermal microelectromechanical system actuators that are activated by Joule heating.

BACKGROUND AND SUMMARY OF THE INVENTION

Microelectromechanical system (MEMS) actuators provide.control of very small components that are formed on semiconductor substrates by conventional semiconductor (e.g., CMOS) fabrication processes. MEMS systems and actuators are sometimes referred to as micromachined systems-on-a-chip.

One of the conventional MEMS actuators is the electrostatic actuator or comb drive. Commonly, such actuators include two comb structures that each have multiple comb fingers aligned in a plane parallel to a substrate. The fingers of the two comb structures are interdigitated with each other. Potential differences applied to the comb structures establish electrostatic interaction between them, thereby moving the comb structures toward and away from each other.

Advantages of the electrostatic actuator are that they require low current, which results in small actuation energy, and have a relatively high frequency response. Disadvantages are that they require high drive voltages (e.g., tens or hundreds of volts) and large areas and provide low output forces. For example, this type of actuator can produce a force of 0.0059 nN/volt$^2$ per comb-finger height ($\mu$m) and can yield an actuator force density of about 20 $\mu$N/mm$^2$, with the area referring to the surface area of the actuator. Comb drive (electrostatic) actuators used for deployment of microstructures typically occupy many times the area of the device they are deploying. Also, the high voltages (e.g., tens or hundreds of volts) required to operate electrostatic actuators can be incompatible and prevent integration With conventional logic and low voltage electronics.

A pseudo-bimorph thermal actuator is an alternative to the electrostatic actuator. These actuators utilize differential thermal expansion of two different-sized polysilicon arms to produce a pseudo-bimorph that deflects in an arc parallel to the substrate. Such a thermal actuator produces much higher forces.(100–400 times) than comb drive actuators and can operate on very low voltages and can achieve about 450 $\mu$N per/mm$^2$ of MEMS chip area. A disadvantage is the additional electrical power that is required and the sweeping or arc motion of the actuator. Two or more actuators may be coupled to a common beam through bending yokes to produce a linear movement, which is usually desired in MEMS systems. However, the bending of such yokes consumes much of the force output of the actuators.

The present invention includes an in-plane thermal buckle-beam microelectrical mechanical actuator formed on a planar substrate of semiconductor material, for example. The actuator includes first and second anchors secured to the substrate and a floating center beam positioned between the first and second anchors and movable relative to the substrate. Symmetric first and second sets of elongated thermal half-beams are secured between opposite sides of the floating center beam and the respective first and second anchors. The half-beams are formed of semiconductor material, such as polysilicon. A current source directs electrical current through the thermal half beams via the anchors to impart thermal expansion of the thermal half-beams and hence linear motion of the floating center beam generally parallel to the substrate.

In one implementation, the half-beams are configured at a bias angle to give the floating beam an affinity for in-plane motion. An actuator of the present invention with such bias angles can give the actuator an overall chevron configuration.

Actuators according to the present invention provide linear output motions, in contrast to conventional thermal actuators that rotate about an axis and must have mechanical linkages to convert the rotational motion to linear in many cases. The resistivity of polysilicon allows the actuator to operate at voltages and currents compatible with standard integrated circuitry (e.g., CMOS). In addition, actuators according to the present invention are very small in area, have relatively high force, and can provide relatively long actuation displacements (e.g. 10–12 microns) at very small increments, making them suitable for deployment of micro-optical devices as well as providing minute adjustments. In one implementation, the present actuator array can produce a force of about 3700 $\mu$N per square mm and with 1.53 mW per $\mu$N of power. This electrically stimulated movement can be used in micro-motors, optical scanning devices, MEMS optical deployment mechanisms and other areas requiring mechanical movement on a micro scale.

Additional objects and advantages of the present invention will be apparent from the detailed description of the preferred embodiment thereof, which proceeds with reference to the accompanying drawings.

BRIEF DESCRIPTION OF THE DRAWINGS

FIGS. 1–15 are cross-section views of a general multi-user MEMS process known in the prior art for fabricating microelectrical mechanical devices. Cross-hatching is omitted to improve clarity of the prior art structure and process depicted.

FIG. 18 is a plan view of a microelectrical mechanical in-plane buckle-beam actuator having multiple pairs of thermal half-beam structures.

FIG. 19 is a plan view of an alignment structure for guiding motion of a center coupling beam.

FIG. 20 is a partial sectional end view of an alignment structure for guiding motion of a center coupling beam.

FIG. 21 is a sectional end view of a dimple bearing extending from a bottom surface of an actuator center beam.

FIG. 22 is a side view showing a pair of dimple bearings positioned on opposite sides of an alignment structure.

FIG. 25 is a flow diagram of an in-plane thermal actuator drive process for operating an in-plane thermal actuator in two dimensions.

FIG. 27 is a flow diagram of an in-plane thermal actuator drive process for driving a linear rack drive as illustrated in FIG. 26.

DETAILED DESCRIPTION OF PREFERRED EMBODIMENTS

Figure 16:
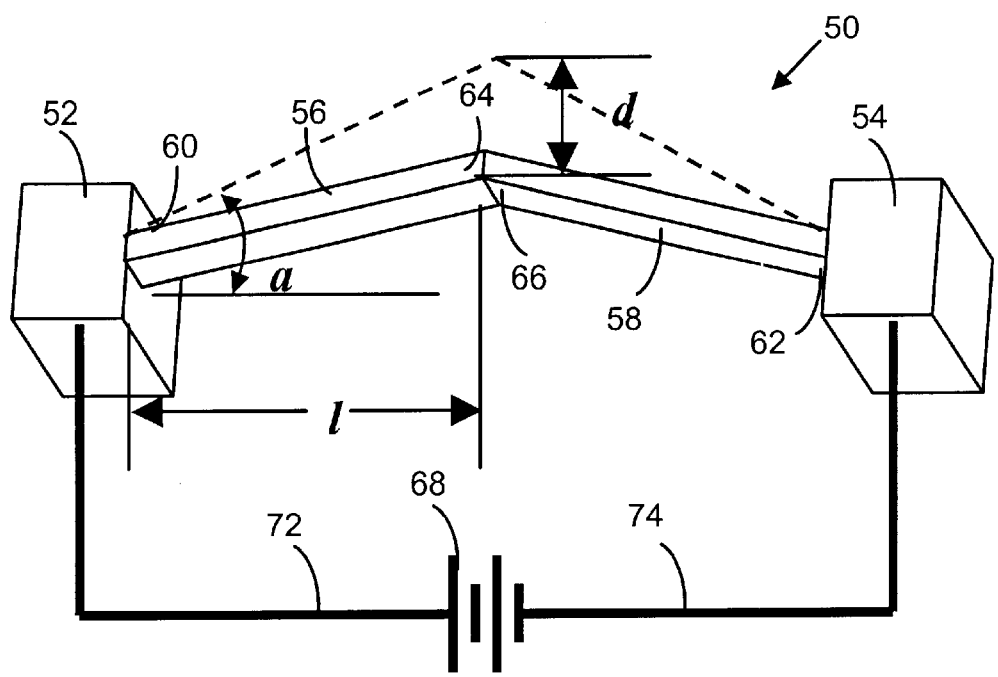
FIG. 16 is a diagrammatic isometric diagram of a microelectrical mechanical in-plane buckle-beam actuator having one pair of thermal half-beam structures.

To assist with understanding the present invention, the general procedure for fabricating micromechanical devices using the MUMPs process is explained with reference to FIGS. 1–15.

The MUMPs process provides three-layers of conformal polysilicon that are etched to create a desired physical structure. The first layer, designated POLY 0, is coupled to a supporting wafer, and the second and third layers, POLY 1 and POLY 2, respectively, are mechanical layers that can be separated from underlying structure by the use of sacrificial layers that separate layers and are removed during the process.

The accompanying figures show a general process for building a micro-motor as provided by the MEMS Technology Applications Center, 3021 Cornwallis Road, Research Triangle Park, N.C.

The MUMPs process begins with a 100 mm n-type silicon wafer 10. The wafer surface is heavily doped with phosphorus in a standard diffusion furnace using POCl 3 as the dopant source. This reduces charge feed-through to the silicon from electrostatic devices subsequently mounted on the wafer. Next, a 600 nm low-stress Low Pressure Chemical Vapor Deposition (LPCVD) silicon nitride layer 12 is deposited on the silicon as an electrical isolation layer. The silicon wafer and silicon nitride layer form a substrate.

Next, a 500 nm LPCVD polysilicon film—POLY 0 14—is deposited onto the substrate. The POLY 0 layer 14 is then patterned by photolithography; a process that includes coating the POLY 0 layer with a photoresist 16, exposing the photoresist with a mask (not shown) and developing the exposed photoresist to create the desired etch mask for subsequent pattern transfer into the POLY 0 layer (FIG. 2). After patterning the photoresist, the POLY 0 layer 14 is etched in a Reactive Ion Etch (RIE) system (FIG. 3).

With reference to FIG. 4, a 2.0 µm phosphosilicate glass (PSG) sacrificial layer 18 is deposited by LPCVD onto the POLY 0 layer 14 and exposed portions of the nitride layer 102. This PSG layer, referred to herein as a First Oxide, is removed at the end of the process to free the first mechanical layer of polysilicon, POLY 1 (described below) from its underlying structure; namely, POLY 0 and the silicon nitride layers. This sacrificial layer is lithographically patterned with a DIMPLES mask to form dimples 20 in the First Oxide layer by RIE (FIG. 5) at a depth of 750 nm. The wafer is then patterned with a third mask layer, ANCHOR1, and etched (FIG. 6) to provide anchor holes 22 that extend through the First Oxide layer to the POLY 0 layer. The ANCHOR 1 holes will be filled in the next step by the POLY 1 layer 24.

After the ANCHOR1 etch, the first structural layer of polysilicon (POLY 1) 24 is deposited at a thickness of 2.0 µm. A thin 200 nm PSG layer 26 is then deposited over the POLY 1 layer 24 and the wafer is annealed (FIG. 7) to dope the POLY 1 layer with phosphorus from the PSG layers. The anneal also reduces stresses in the POLY 1 layer. The POLY 1 and PSG masking layers 24, 26 are lithographically patterned to form the structure of the POLY1 layer. After etching the POLY 1 layer (FIG. 8), the photoresist is stripped and the remaining oxide mask is removed by RIE.

After the POLY 1 layer 24 is etched, a second PSG layer (hereinafter "Second Oxide") 28 is deposited (FIG. 9). The Second Oxide is patterned using two different etch masks with different objectives.

First, a POLY1_POLY2_VIA etch (depicted at 30) provides for etch holes in the Second Oxide down to the POLY 1 layer 24. This etch provide a mechanical and electrical connection between the POLY 1 layer and a subsequent POLY2 layer. The POLY1_POLY2_VIA layer is lithographically patterned and etched by RIE (FIG. 10).

Second, an ANCHOR2 etch (depicted at 32) is provided to etch both the First and Second Oxide layers 18, 28 and POLY 1 layer 24 in one step (FIG. 11). For the ANCHOR2 etch, the Second Oxide layer is lithographically patterned and etched by RIE in the same way as the POLY1_POLY2_VIA etch. FIG. 11 shows the wafer cross section after both POLY1_POLY2_VIA and ANCHOR2 etches have been completed.

A second structural layer, POLY 2, 34 is then deposited at a thickness of 1.5 µm, followed by a deposition of 200 nm of PSG. The wafer is then annealed to dope the POLY 2 layer and reduce its residual film stresses. Next, the POLY 2 layer is lithographically patterned with a seventh mask and the PSG and POLY 2 layers are etched by RIE. The photoresist can then be stripped and the masking oxide is removed (FIG. 13).

The final deposited layer in the MUMPs process is a 0.5 µm metal layer 36 that provides for probing, bonding, electrical routing and highly reflective mirror surfaces. The wafer is patterned lithographically with the eighth mask and the metal is deposited and patterned using a lift-off technique. The final, unreleased exemplary structure is shown in FIG. 14.

Lastly, the wafers undergo sacrificial release and test using known methods. FIG. 15 shows the device after the sacrificial oxides have been released.

In preferred embodiments, the device of the present invention is fabricated by the MUMPs process in accordance with the steps described above. However, the device of the present invention does not employ the specific masks shown in the general process of FIGS. 1–15, but rather employs masks specific to the structure of the present invention. Also, the steps described above for the MUMPs process may change as dictated by the MEMS Technology Applications Center. The fabrication process is not a part of the present invention and is only one of several processes that can be used to make the present invention.

FIG. 16 is a diagrammatic isometric illustration of a microelectrical mechanical in-plane thermal buckle-beam actuator 50. Actuator 50 includes a pair of structural anchors 52 and 54 that are secured to a substrate (e.g., substrate 10 or nitride layer 12, not shown) and thermal half-beams 56 and 58 that are secured at their base ends 60 and 62 to anchors 52 and 54, respectively. Half-beams 56 and 58 extend substantially parallel to and spaced-apart from the substrate and meet each other at their respective distal ends 64 and 66.

As described below in greater detail, structural anchors 52 and 54 and half-beams 56 and 58 have electrically semiconductive and positive coefficient of thermal expansion properties. Actuator 50 is activated when an electrical current is passed from a current source 68 through half-beams 56 and 58 via electrically conductive couplings 72 and 74 and respective structural anchors 52 and 54. The applied current induces ohmic or Joule heating of half-beams 56 and 58, thereby causing them to expand longitudinally toward each other and ultimately to buckle.

In the illustrated implementation, half-beams 56 and 58 are each formed at an in-plane bias angle a relative to a line extending between respective anchors 52 and 54. The bias angles of half-beams 56 and 58 are structural features that provide an affinity for half-beams 56 and 58 to move in-plane (parallel to the substrate) when they buckle. The actuator displacement d is given by $$d = [l^2 + 2(l)l' - (l\cos(a))^2]^{1/2} - l\sin(a)$$

where

I is the distance between the anchors associated with a half-beam,

I' is the elongation of the half-beam due to thermal expansion, and a is the pre-bend angle of the beam.

The coefficient of thermal expansion used for polysilicon is $2.33 \times 10^{-6}/°C$.

Figure 17:
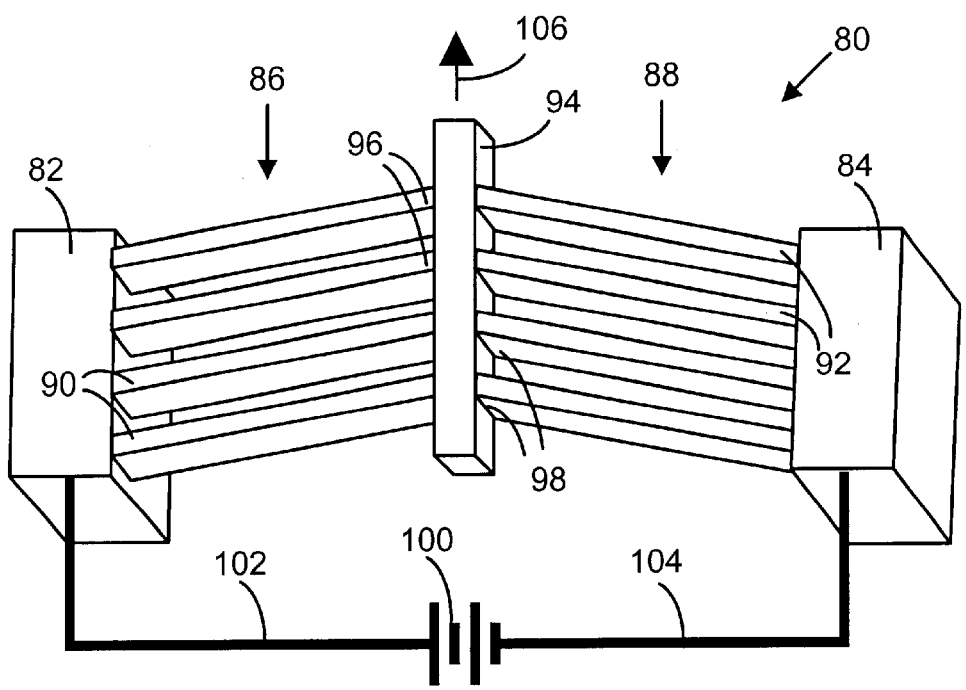
FIG. 17 is a diagrammatic isometric diagram of a microelectrical mechanical in-plane buckle-beam actuator having multiple pairs of thermal half-beam structures.

FIG. 17 is a diagrammatic isometric illustration of a microelectrical mechanical in-plane thermal buckle-beam actuator 80 having a pair of structural anchors 82 and 84 secured to a substrate (e.g., substrate 10 or nitride layer 12, not shown). Multiple thermal half-beams 86 and 88 (four of each shown) are secured at their base ends 90 and 92 to anchors 82 and 84, respectively. Half-beams 86 and 88 extend over the substrate and meet opposite sides of a floating center coupling beam 94 at their respective distal ends 96 and 98.

Center beam 94 provides mechanical coupling of the multiple half-beams 86 and 88 as well as providing structure for transmitting the resulting linear force to another device. In addition, center beam 94 stiffens the middle of actuator 80 where half-beams 86 and 88 meet. Multiple half-beams 86 and 88 are formed at in-plane bias angles to provide an affinity for them to move in-plane (parallel to the substrate). The in-plane bias angles of half-beams 86 and 88 relative to anchors 82 and 84 give actuator 80 an overall chevron configuration.

In one implementation, anchors 82 and 84, half-beams 86 and 88, and center beam 94 are each made in the same semiconductor layer or layers (e.g., polysilicon). With reference to the structures of FIGS. 1–15, for example, anchors 82 and 84 are secured-to insulating nitride layer 12 on substrate 10. Half-beams 86 and 88 and center beam 94 are released from substrate 10 and free to move relative thereto. Current is applied from a current source 100 through electrically conductive couplings 102 and 104 to anchors 82 and 84. The current passes through half-beams 86 and 88, which heats them and causes them to lengthen due to the positive temperature coefficient of expansion of silicon. As a result, center beam 94 moves and exerts a force outward along a linear axis 106, parallel to substrate 10. When the current ceases, half-beams 86 and 88 cool and contract, which causes center beam 94 to return to its initial position with a force equal to the actuation force, but in an opposite direction along axis 106.

In one implementation, half-beams 86 and 88 have cross-sectional dimensions of 2 μm×2 μm and lengths of between 200 μm and 220 μm. It will be appreciated, however, that these dimensions are merely exemplary. For example, half-beams 86 and 88, as well as anchors 82 and 84 and center beam 94, can be fabricated out of either or both of the releasable MUMPs polysilicon layers, but with anchors 82 and 84 not being released. In such MUMPS implementations, actuator 80 can have possible thicknesses of 1.5, 2.0 or 3.5 μm.

Generally, the present invention is adaptable to any fabrication process that includes at least one releasable layer that has a positive temperature coefficient of expansion and is capable of carrying a current for ohmic heating. Moreover, there is no theoretical limit to the number of half-beams 86 and 88 so long as the actuator and its associated conductors can handle the current and heat, the beams can lose heat rapidly, and there is not significant cross coupling of heat between half-beams. In one implementation, the heating temperature was kept below 800° C. to prevent self-annealing, which can cause irreversible damage.

FIG. 18 is a diagrammatic plan view of a microelectrical mechanical in-plane thermal buckle-beam actuator 120 that is analogous to actuator 80. Actuator 120 includes a pair of structural anchors 122 and 124 mechanically secured to and electrically insulated from a substrate (e.g., substrate 10, not shown). Multiple thermal half-beams 126 and 128 are secured at their base ends 130 and 132 to anchors 122 and 124, respectively. Half-beams 126 and 128 extend over the substrate and meet a floating center coupling beam 134 at their respective distal ends 136 and 138. The free, floating motion of center beam 134 is guided along a line or axis of motion 140 by two or more alignment structures (e.g., four shown) 142. Alignment structures 142 are shown in greater detail in FIGS. 19 and 20.

FIG. 19 is a top plan view showing alignment structure 142 with a guide 144 that extends at least partly across a top surface 146 of center beam 134. FIG. 20 is a partial section end view of the same. Guide 144 includes a base 148 that extends from the substrate (e.g., substrate 10) through a slotted aperture 150 in center beam 134. Guide 144 may be formed, for example, as a second polysilicon layer, POLY2, in a conventional MUMPS process. Alignment structures 142 function to guide center beam 134 along its axis of motion 140 and to prevent out-of-plane excursions by center beam 134.

FIG. 21 is a sectional end view of a dimple bearing 160 extending from a bottom surface 162 of center beam 134, for example, to prevent stiction by a reduction of contacting surface area where center beam 134 is in contact with substrate 10 (e.g., the nitride layer 12). In one implementation, center beam 134 would include multiple spaced-apart dimple bearings 160. For example, dimple bearings 160 (only one shown) that extend from bottom surface 162 by 0.5 μm help reduce the surface area of released polysilicon structures that would normally have contact with substrate 10 (e.g., the nitride layer 12). FIG. 22 is a side view showing a pair of dimple bearings 160 positioned on opposite sides of an alignment structure 142.

Figure 23:
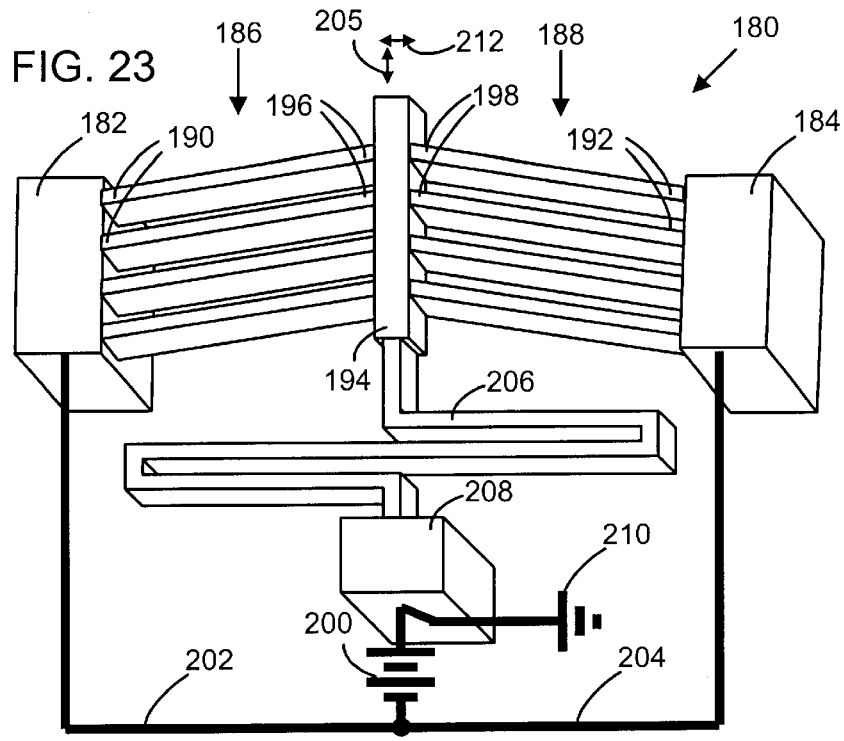
FIG. 23 is a diagrammatic isometric illustration of a microelectrical mechanical in-plane thermal buckle-beam actuator with a center beam having a separate electrical connection.

FIG. 23 is a diagrammatic isometric illustration of a microelectrical mechanical in-plane thermal buckle-beam actuator 180 having a pair of structural anchors 182 and 184 secured to a substrate (e.g., substrate 10, not shown). Multiple thermal half-beams 186 and 188 (four or each shown) are secured at their base ends 190 and 192 to anchors 182 and 184, respectively. Half-beams 186 and 188 extend over the substrate and meet a floating center coupling beam 194 at their respective distal ends 196 and 198.

Actuator 180 is activated when a current is passed from a current source 200 through half-beams 186 and 188 via conductive electrical couplings 202 and 204 and structural anchors 182 and 184. The applied current induces ohmic or Joule heating of half-beams 186 and 188, thereby causing them to expand and ultimately buckle in a plane parallel to the substrate, thereby extending center beam 194 along its longitudinal axis 205. In addition, center beam 194 is connected to a floating, flexible conductor 206 that terminates at a conductor anchor 208. Anchor 208 is similar to anchors 182 and 184, but is connected to electrical ground 210 to thereby ground center beam 194.

Current in actuators 80 and 120 passes from one anchor to the other, placing the center-coupling beam at a voltage midpoint between the voltages of the anchors. In contrast, current in actuator 180 is fed from both anchors 182 and 184 toward center beam 194, which is at ground or a common mode potential. The configuration of actuator 180 eliminates common mode currents that can otherwise arise between multiple actuators.

In addition, the configuration of actuator 180 allows different currents to be passed through half-beams 186 and 188. When equal currents are passed through both sets of half beams in actuators 80, 120, or 180, the half-beams on both sides of the corresponding center beams expand by the same amount and move the center beams generally in-plane along only one linear axis. When unequal or asymmetric currents are passed through the two sets of half beams 186 and 188 in actuator 180, half-beams 186 and 188 on the two sides of center beam 194 expand or contract by different amounts, thereby moving center beam 194 generally in-plane along its primary linear axis 205 and a transverse linear axis 212. Operating actuator 180 in such a manner allows center beam 194 to be driven along two transverse (e.g., orthogonal) in-plane axes.

Figure 24:
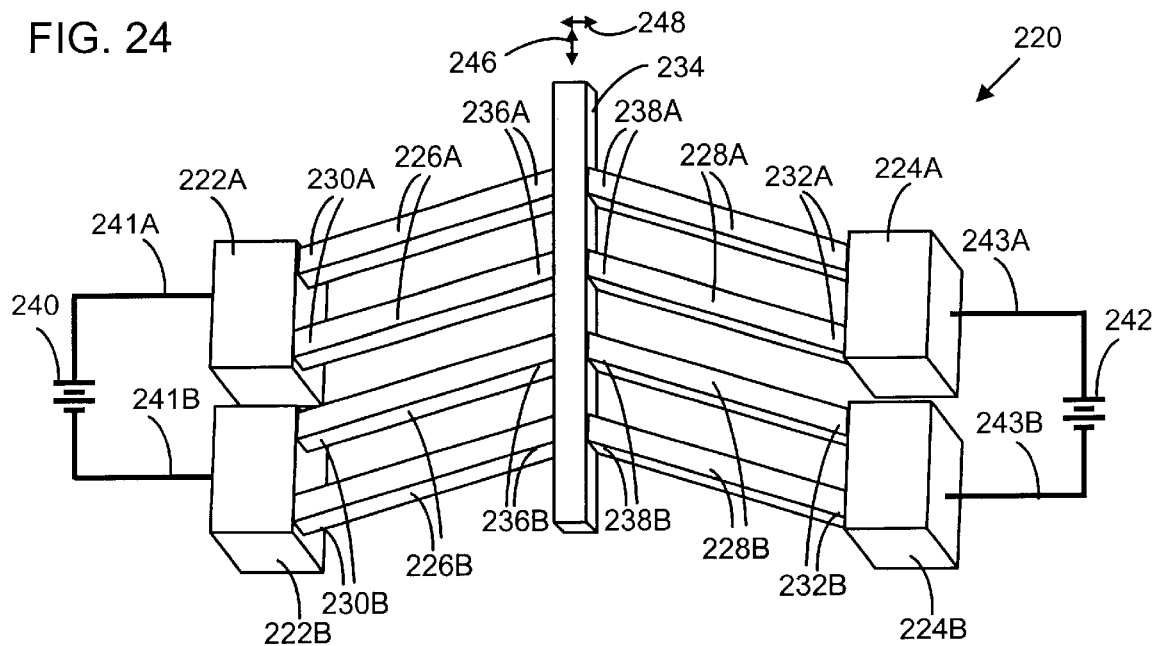
FIG. 24 is a diagrammatic isometric illustration of a microelectrical mechanical in-plane thermal buckle-beam actuator with multiple adjacent anchors on each side of a center beam.

FIG. 24 is a diagrammatic isometric illustration of a microelectrical mechanical in-plane thermal buckle-beam actuator 220 that can be operated with unequal or asymmetric currents, like actuator 180, to be selectively driven along two transverse (e.g., orthogonal) in-plane axes. Actuator 220 includes two pairs of structural anchors 222A, 222B and 224A, 224B secured to a substrate (e.g., substrate 10 or nitride layer 12, not shown).

Multiple thermal half-beams 226A, 226B are secured at their base ends 230A, 230B to anchors 222A, 222B, respectively. Multiple thermal half-beams 228A, 228B are secured at their base ends 232A, 232B to anchors 224A, 224B, respectively. Half-beams 226 and 228 extend over the substrate and meet opposite sides of a floating center coupling beam 234 at their respective distal ends 236 and 238. Multiple half-beams 226 and 228 can be formed at in-plane bias angles to provide an affinity for them to move in-plane (parallel to the substrate). The in-plane bias angles of half-beams 226 and 228 relative to anchors 222 and 224 can give actuator 220 an overall chevron configuration.

Actuator 220 is analogous to actuators 80 and 180. In one implementation, anchors 222 and 224, half-beams 226 and 228, and center beam 234 are each made in the same semiconductor layer or layers (e.g., polysilicon). With reference to the structures of FIGS. 1–15, for example, anchors 222 and 224 are secured to insulating nitride layer 12 on substrate 10. Half-beams 226 and 228 and center beam 234 are released from substrate 10 and free to move relative thereto.

Current is applied to half-beams 226 from a current source 240 through electrically conductive couplings 241A, 241B to anchors 222A, 222B. The current passes through half-beams 226A, 226B, which heats them and causes them to lengthen due to the positive temperature coefficient of expansion of silicon.

Similarly, current is applied to half-beams 228 from a current source 242 through electrically conductive couplings 243A, 243B to anchors 224A, 224B. The current passes through half-beams 228A, 228B, which heats them and causes them to lengthen due to the positive temperature coefficient of expansion of silicon. As a result, center beam 234 moves and exerts a force outward along a linear axis 246, parallel to substrate 10. When the current ceases, half-beams 226 and 228 cool and contract, which causes center beam 234 to return to its initial position with a force equal to the actuation force, but in an opposite direction along axis 246.

The configuration of actuator 220 allows different currents to be passed through half-beams 226 and 228. When equal currents are passed through both sets of half beams in actuators 80, 120, 180, or 220, the half-beams on both sides of the corresponding center beams expand by the same amount and move the center beams generally in-plane along only one linear axis. When unequal or asymmetric currents are passed through the two sets of half beams 226 and 228 in actuator 220, half-beams 226 and 228 on the two sides of center beam 234 expand or contract by different amounts, thereby moving center beam 234 generally in-plane along its primary linear axis 248 and a transverse linear axis 246. Operating actuator 220 in such a manner allows center beam 234 to be driven along two transverse (e.g., orthogonal) in-plane axes.

FIG. 25 is a flow diagram of an in-plane thermal actuator drive process 250 for operating an in-plane thermal actuator in two dimensions. Actuator drive process 250 illustrates an exemplary implementation of asymmetric drive currents to operate in-plane thermal actuator 180, for example, but is similarly applicable to in-plane thermal actuator 220.

Process block 252 indicates that half-beam sets 186 and 188 receive a symmetric or common current. This common or symmetric drive current induces in half-beams 186 and 188 the same amount of thermal expansion, thereby extending center beam 194 along its longitudinal axis 205. For example, the symmetric drive currents may be applied to half-beam sets 186 and 188 during a first time period.

Process block 254 indicates that one of half-beam sets 186 and 188 receives less current than the other of half-beam sets 186 and 188. For example, half-beam set 186 receives less current than half-beam set 188. This asymmetric drive current causes the half-beam set receiving less current (e.g., a zero or non-zero current) to contract in comparison to the other half-beam set, thereby causing center beam 194 to move along axis 212 transverse (e.g., orthogonal) to longitudinal axis 205. For example, the asymmetric drive currents may be applied to half-beam sets 186 and 188 during a second time period.

Process block 256 indicates that half-beam sets 186 and 188 both receive no current, thereby allowing center beam 194 to return to its initial position. Process block 256 may then return to process block 252, for example.

Figure 26:
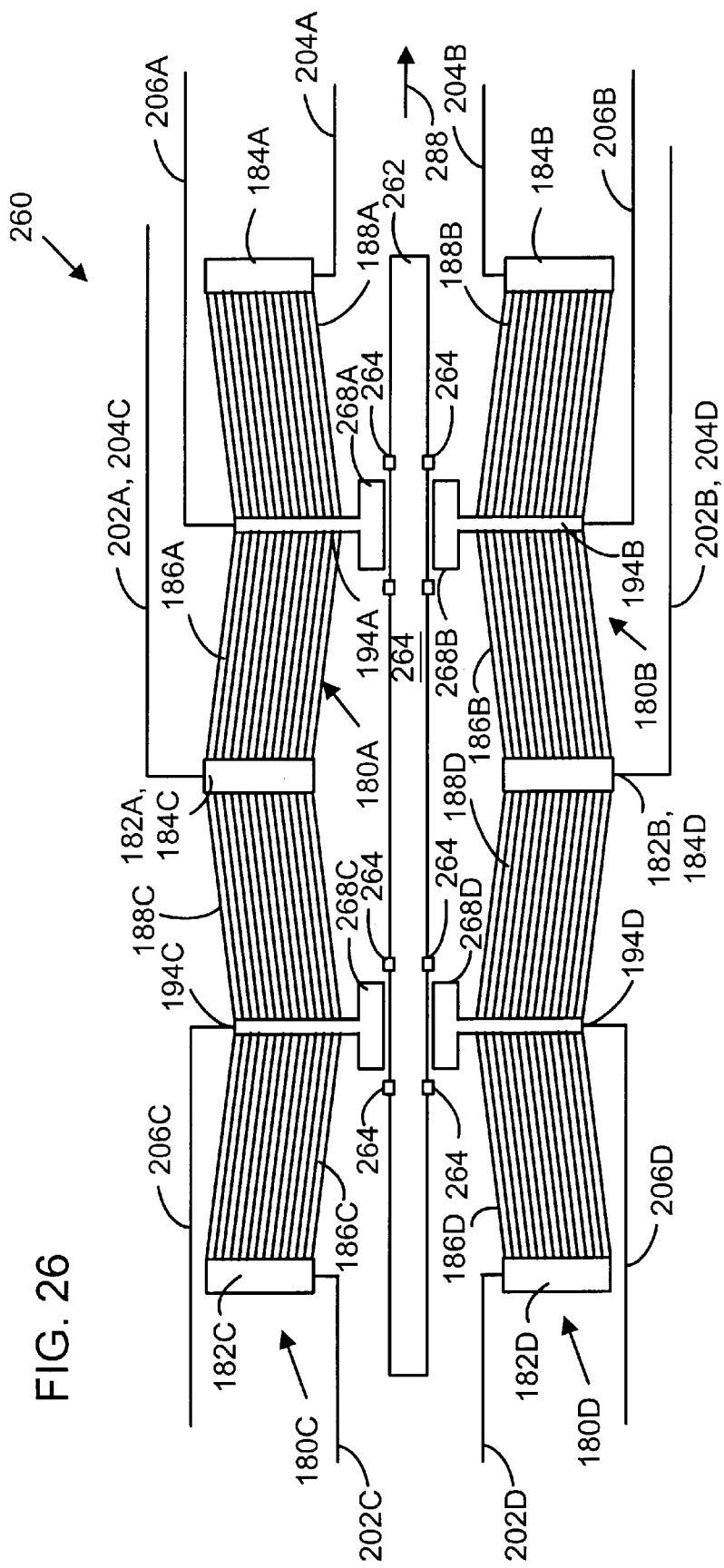
FIG. 26 is a diagrammatic plan view of a microelectrical mechanical in-plane buckle-beam actuator assembly with multiple actuators and a floating slider that together function as a linear rack drive.

FIG. 26 is a diagrammatic plan view of a microelectrical mechanical in-plane buckle-beam actuator assembly 260 with multiple (e.g., four) actuators 180A–180D that are positioned in pairs on opposite sides of a floating slider 262. Slider 262 is formed of a semiconductor material, such as a POLY1 or POLY2 layer, and is released from the substrate to float over it. Multiple slider alignment guides 264 (e.g., four pairs shown) are secured to the substrate and include tongues that extend over and are not secured to a top surface 266 of slider 262. Slider alignment guides 264 are similar in function and structure to guides 142 (FIGS. 19 and 20). Center beams 194 each include a widened clamping bar 268 to frictionally engage sides of slider 262. Actuator assembly 260 functions as a linear rack drive in which actuators 180 are used to advance slider 262 through friction and can be used to deploy MEMS out-of-plane devices such as those used in free-space optical systems.

FIG. 27 is a flow diagram of an in-plane thermal actuator drive process 280 for driving a linear rack drive as illustrated in FIG. 26.

Process block 282 indicates an initial condition in which none of clamping bars 268 is engaged with slider 262.

Process block 284 indicates that a first opposed pair of actuators (e.g., actuators 180A and 180B) are driven with symmetric drive currents to extend center beams 194A and 194B to frictionally engage respective clamping bars 268A and 268B with the sides of slider 262.

Process block 286 indicates that the first opposed pair of actuators are driven asymmetrically, with the half-beam sets in the direction of motion 288 (e.g., sets 188A and 188B) receiving less current than the half-beam sets (e.g., sets 186A and 186B) opposite direction of motion 288. These asymmetric drive currents cause the half-beam sets in the-.direction of motion 288 (e.g., sets 188A and 188B) to contract while the other half-beam sets (e.g., sets 186A and 186B) expand, thereby causing center beams 194A and 194B to move slider 262 in direction 288.

Process block 290 indicates that a second opposed pair of actuators (e.g., actuators 180C and 180D) are driven with symmetric drive currents to frictionally engage respective clamping bars 268C and 268D with the sides of slider 262. At this step, the second opposed pair of actuators (e.g., actuators 180C and 180D) function as a break to prevent slider 262 from inadvertently moving opposite motion direction 288.

Process block 292 indicates that drive current to the first opposed pair of actuators (e.g., sets 180A and 180B) is withdrawn to retract their clamping bars 268A and 268B from the sides of slider 262.

Process block 294 indicates that the second opposed pair of actuators are driven asymmetrically, with the half-beam sets in the direction of motion 288 (e.g., sets 188C and 188D) receiving less current than the half-beam sets (e.g., sets 186C and 186D) opposite direction of motion 288. These asymmetric drive currents cause the half-beam sets in the direction of motion 288 (e.g., sets 188C and 188D) to contract while the other half-beam sets (e.g., sets 186C and 186D) expand, thereby causing center beams 194C and 194D to move slider 262 in direction in direction 288.

Process block 296 indicates that first opposed pair of actuators (e.g., actuators 180A and 180B) are driven with symmetric drive currents to frictionally engage respective clamping bars 268A and 268B with the sides of slider 262.

Process block 298 indicates that drive current to the second opposed pair of actuators (e.g., sets 188C and 188D) is withdrawn to retract their clamping bars 268C and 268D from the sides of slider 262. Process block 298 returns to process block 286.

Figure 28:
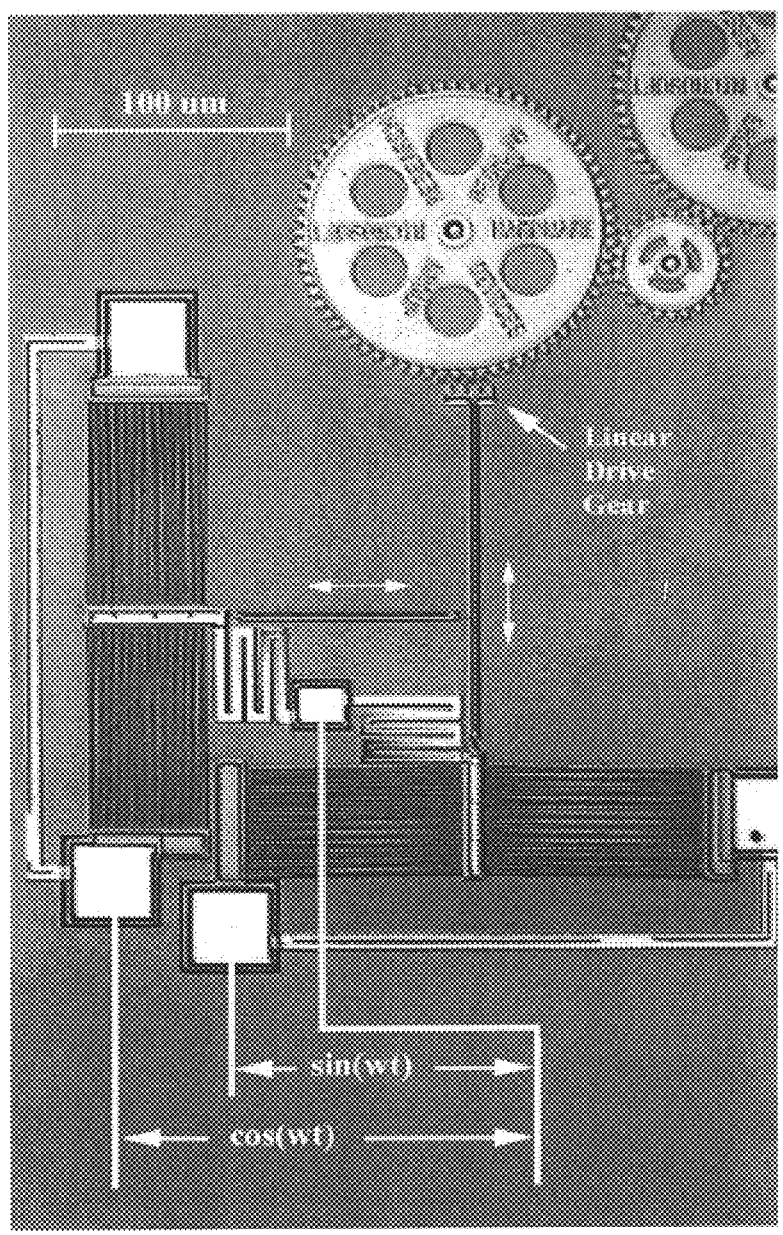
FIG. 28 is a photomicrograph showing an example of a gear motor powered by actuator arrays of the type illustrated in FIG. 23.

FIG. 28 is a photomicrograph showing an example of a gear motor powered by two actuator arrays 180. The actuators are excited in phase quadrature. This phase difference causes the linear drive gear to move in a circular motion, meshing about half of the time With the larger circular gear. Square wave signals such as the output from CMOS digital circuitry may also be used to actuate this motor. If the amplitude is adjusted properly, the drive gear will advance the circular gear by one tooth for each four-phase period. The result is similar to a four-phase stepper motor, though only one phase produces gear drive. In the illustrated implementation, the motor is capable of speeds around 1,600 rpm.

Figure 29:
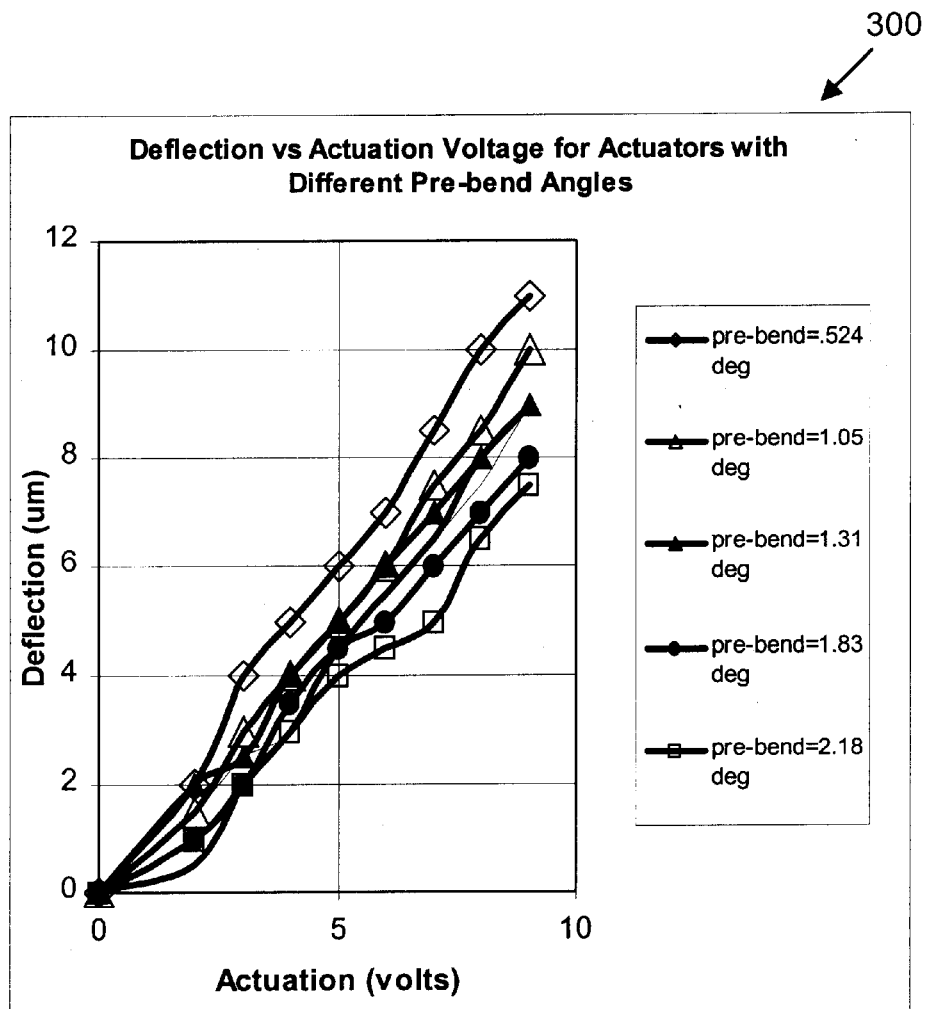
FIG. 29 is a graph illustrating actuator center bar deflection for a series of actuators with various pre-bends and excitation voltages.

FIG. 29 is a graph 300 illustrating actuator center bar deflection for a series of 2 $\mu$m actuators with various excitation voltages and bias angles (referred to as pre-bends) of between 0.524 degrees and 2.18 degrees. Graph 300 indicates that the actuators exhibit a generally linear response when the excitation is above 2 volts. The slope of the curves indicates the higher the pre-bend angle, the lower the deflection. Deflection response was measured to be around 2 KHz. This was measured by increasing the excitation frequency until the measured deflection fell to half the maximum amplitude. Preliminary tests indicate that an order of magnitude increase in usable actuation frequency can be realized by using a mechanically high-Q structure operating at resonance.

Actuators according to the present invention provide linear output motions, in contrast to conventional thermal actuators that rotate about an axis and must have mechanical linkages to convert the rotational motion to linear in many cases. The resistivity of polysilicon allows the actuator to operate at voltages and currents compatible with standard integrated circuitry (e.g., CMOS). In addition, actuators according to the present invention are very small in area, have relatively high force, and can provide relatively long actuation displacements (e.g. 10–12 microns) at very small increments, making them suitable for deployment of microoptical devices as well as providing minute adjustments. In one implementation, the present actuator array can produce a force of about 3700 $\mu$N per square mm and with 1.53 mW per $\mu$N of power. This electrically stimulated movement can be used in micro-motors, optical scanning devices, MEMS optical deployment mechanisms and other areas requiring mechanical movement on a micro scale.

Parts of the description of the preferred embodiment refer to steps of the MUMPs fabrication process described above. However, as stated, MUMPs is a general fabrication process that accommodates a wide range of MEMS device designs. Consequently, a fabrication process that is specifically designed for the present invention will likely include different steps, additional steps, different dimensions and thickness, and different materials. Such specific fabrication processes are within the ken of persons skilled in the art of photolithographic processes and are not a part of the present invention.

In view of the many possible embodiments to which the principles of our invention may be applied, it should be recognized that the detailed embodiments are illustrative only and should not be taken as limiting the scope of our invention. Rather, I claim as my invention all such embodiments as may come within the scope and spirit of the following claims and equivalents thereto.

What is claimed is:

1. A planar-motion thermal microelectrical mechanical actuator system, comprising:
    plural linear-motion thermal microelectrical mechanical actuators positioned on a planar substrate and engaging an elongate member at different positions along its length to move the member relative to the substrate, wherein each of the plural actuators includes:
    (a) first and second anchors secured to the substrate;
    (b) plural elongated thermal half-beams that each have a base end secured to the first anchor and a distal end that is positioned between the first and second anchors;
    (c) plural elongated thermal half-beams that each have a base end secured to the second anchor and a distal end that is positioned between the first and second anchors; and (d) electrical couplings to direct electrical current through the thermal half beams via the anchors to impart thermal expansion of the thermal half-beams and motion of their distal ends to provide actuation of the elongate member.

2. The actuator system of claim 1 in which the plural actuators are arranged on opposite sides of the elongate member.

3. The actuator system of claim 1 in which the plural actuators include plural pairs of actuators.

4. The actuator system of claim 3 in which each actuator further includes a floating center beam that is positioned between the first and second anchors and movable relative to the substrate, the distal ends of the thermal half-beams being secured to the floating center beam so that thermal expansion of the thermal half-beams and motion of their distal ends drives the floating center beam against the elongate member to provide actuation of the elongate member.

5. The actuator system of claim 4 in which the floating center beam of each actuator releasably engages the elongate member.

6. The actuator system of claim 4 in which the floating center beam of each actuator is oriented and moveable transverse to the length of the elongate member.

7. The actuator system of claim 1 further comprising means for actuating the plural actuators in a sequence to cooperatively actuate the elongate member.

8. The actuator system of claim 1 in which the actuation of the elongate member moves it only in a direction parallel to its length.

9. A planar-motion thermal microelectrical mechanical actuator, comprising:

a planar substrate with first, second, third, and fourth anchors secured thereto;

a floating center beam positioned between the first and second anchors and between the third and fourth anchors and movable relative to the substrate;

symmetric first and second sets of elongated thermal half-beams that are secured on a first side of the floating center beam and between the first and second anchors;

symmetric third and fourth sets of elongated thermal half-beams that are secured on a second side of the floating center beam and between the third and fourth anchors; and first electrical couplings to direct a first electrical current through the thermal half beams secured to one pair of the anchors and second electrical couplings to direct a second electrical current through the thermal half beams secured to a second pair of the anchors to impart thermal expansion of the thermal half-beams and motion of the floating center-beam.

10. The actuator of claim 9 in which the first and second electrical currents are the same.

11. The actuator of claim 9 in which the first and second electrical current currents are different.

12. The actuator of claim 9 in which the first and second anchors are positioned together on one side of the floating center beam and the third and fourth anchors are positioned together on another side of the floating center beam, the first electrical couplings directing the first electrical current through the thermal half beams secured to the first and second anchors and second electrical couplings directing the second electrical current through the thermal half beams secured to the third and fourth anchors.

13. The actuator of claim 12 in which the first and second electrical currents are the same.

14. The actuator of claim 12 in which the first and second electrical current are different.

15. A planar thermal microelectrical mechanical actuator actuation method, comprising:

passing a first electrical current through a first set of elongated thermal half-beams that are secured to a first pair of substrate anchors to impart in the thermal half-beams a thermal expansion that induces a first planar motion to an elongate member; and passing a second electrical current through a second set of elongated thermal half-beams that are secured to a second pair of substrate anchors to impart in the thermal half-beams a thermal expansion that induces a second planar motion to the elongate member.

16. The method of claim 15 in which the first and second electrical currents are substantially the same and the method further comprises passing the first and second electrical currents through the first and second sets of elongated thermal half-beams at substantially the same time.

17. The method of claim 15 in which the first electrical current is greater than the second electrical current and the method further comprises passing the first and second electrical currents through the first and second sets of elongated thermal half-beams at substantially the same time.

* * * * *